United States Patent
Beadnell et al.

(10) Patent No.: US 11,709,982 B2
(45) Date of Patent: Jul. 25, 2023

(54) ENHANCED COVERAGE CONVERGENCE AND TEST STATUS DURING SIMULATION RUNTIME

(71) Applicant: Kioxia Corporation, Tokyo (JP)

(72) Inventors: Duncan Beadnell, Abingdon (GB); Francesco Forte, Swindon (GB)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/491,069

(22) Filed: Sep. 30, 2021

(65) Prior Publication Data

US 2023/0094798 A1   Mar. 30, 2023

(51) Int. Cl.
*G06F 30/3308* (2020.01)
*G06F 7/58* (2006.01)

(52) U.S. Cl.
CPC .......... *G06F 30/3308* (2020.01); *G06F 7/588* (2013.01)

(58) Field of Classification Search
USPC ........................................................ 716/106
See application file for complete search history.

(56) References Cited

U.S. PATENT DOCUMENTS

2021/0156911 A1*  5/2021  Motika .......... G01R 31/318385

* cited by examiner

*Primary Examiner* — Bryce M Aisaka
(74) *Attorney, Agent, or Firm* — Allen & Overy LLP

(57) ABSTRACT

The present invention pertains to a method of verifying a design of an integrated circuit. The methods executes an iteration of simulation test cycle using a digital representation of the design. Next, the method obtains simulation results from the iteration of the simulation test cycle and calculates, during the simulation test cycle, a test coverage value associated with the simulation results of the iteration of the simulation test cycle. If the test coverage value is less than a target value, the method determines if the simulation test cycle fails to satisfies an iteration limiting metric. If the simulation test cycle satisfies the iteration limiting metric, the method, dynamically adjusts one or more simulation test cycle parameter during the simulation test cycle and iterates the simulation test cycle and recalculating the test coverage value until the test coverage value is at least the target value or the simulation test cycle fails to satisfy the iteration limiting metric. The method then out puts a result of the verification of the design.

19 Claims, 3 Drawing Sheets

ENHANCED COVERAGE CONVERGENCE AND TEST STATUS DURING SIMULATION RUNTIME

FIELD

The present disclosure relates generally to the simulation and testing of integrated circuit designs, and more particularly, to an optimized verification process that maintains a desired coverage to ensure the functional integrity of the test results.

BACKGROUND

Integrated circuit development generally includes a design phase and a verification phase for determining whether a design works as expected. The verification phase typically involves the use of a simulator or testbench whose functions include accepting software written in a hardware description language (HDL) which models a circuit design. The model is used to simulates a response of a circuit design under test (DUT) to stimuli that are applied by a test case. Such stimuli represents the inputs received by a system in which the circuit is to be implemented, such as, for example, an NVMe™ system (NVMe™ is an acronym for "NVM express," where "NVM" stands for non-volatile memory, hereinafter NVMe), and may be used to exercise the design according to a known behavior of the system.

The stimulus may be randomized in a controlled manner (termed constrained random stimulus) to generate multiple testing pathways for a design. It can take multiple simulations or long simulations to ensure that all the possible stimulus options in such a system are covered to meet a functional coverage target. All-in-one simulator tools, such as Chronologic Verilog Compiler and Simulator (VCS®), may be used in integrated circuit design for circuit testing and functional verification. SystemVerilog is currently a popular language for a testbench and test case. Scripting languages such as TCL (Tool Command Language), and/or modeling languages can be useful for test case emulation.

A test case is generally a set of test conditions for a DUT and characterized by a known input and an expected output. The results are analyzed in view of the level of coverage desired, and may vary with each input stimuli based on the complexity of the design. Coverage testing can include, but is not limited to, confirming all the desired inputs have been tested and/or verifying desired internal states of the system. However, a skilled artisan would understand that coverage is not limited to the preceding examples, such as specific transition between states. The results are used to debug the design if the resultant coverage falls short of a desired level. However, such testing and design verification of a DUT are time-consuming tasks. The more time-consuming parts of the simulation include creating the tests and expected coverage sequence, running multiple iterations of the test, and evaluating the coverage results, and then modifying any of these parts should the DUT need to be changed based on the coverage results. These can be very time-consuming tasks that may require constant input from a circuit designer.

Should a test design not adequately cover all input stimuli, which is more likely with increasingly complex circuits, one of the only traditional solutions, other than complete test redesigns, is to use a different seed for a random number generator (RNG) and hope that the desired stimuli are covered. In essence, the traditional process is little more than trying to rerun the tests indefinitely until all the desired scenarios are tested with only after posttest cycle manual intervention providing any changes. In fact, with current traditional testing approaches, it may not even be possible to guarantee that every test has been run without time consuming manual interventions. Developers are often left having to conduct independent specific tests that are missed by the current randomized approach.

Even in circumstances where the engineer has detailed control over test parameters, these cannot be access or modified during the testing cycle. Thus, even if an engineer could monitor the test in real-time and receive results in real-time, the engineer would be unable to modify the parameters until the test cycle ended.

As a result, traditional testing approaches require significant commitment and supervising from engineers. Engineers lack the ability to adjust the test while it is in progress, and even after a test is completed, there is limited adjustment options and the impact thereof cannot be determined until after the next testing cycle completes. This creates a fundamental bottleneck in testing systems such that even the most advanced testing system need regular human supervision and manual adjustment. Further, these can only occur after a test has completed, which could take a great deal of time even if it could be determined the test will never achieve the desired outcomes.

There is therefore a long felt need to optimize the testing and verification phases of such simulations during runtime to improve the efficiency and function of the testbench. There is also a long felt need to not just automate time-consuming tasks, but to eliminate or reduce the need for them using innovations in computing technology that cannot be replicated by humans. That is, there is a long felt need and desire for an improve testbench implementing an improved testing methodology.

SUMMARY OF THE INVENTION

To provide an overall understanding of the systems and methods described herein, certain illustrative embodiments will be described. Although the embodiments and features described herein are specifically described for use in connection with verifying a design of an integrated circuit, it will be understood that all the components and other features outlined below may be combined with one another in any suitable manner and may be adapted and applied to other types of circuit verification to enhance the performance of said systems and methods by determining a coverage value associated with a set of simulation results from each iteration of a simulation test cycle, and automatically determining if the coverage of the design is sufficient to preserve the functional integrity of the associated circuit.

Certain embodiments of the present invention present a method that verifies design of an integrated circuit. The methods executes an iteration of simulation test cycle using a digital representation of the design. Next, the method obtains simulation results from the iteration of the simulation test cycle and calculates, during the simulation test cycle, a test coverage value associated with the simulation results of the iteration of the simulation test cycle. If the test coverage value is less than a target value, the method determines if the simulation test cycle fails to satisfies an iteration limiting metric. If the simulation test cycle satisfies the iteration limiting metric, the method, dynamically adjusts one or more simulation test cycle parameter during the simulation test cycle and iterates the simulation test cycle and recalculating the test coverage value until the test coverage value is at least the target value or the simulation test cycle fails to satisfy the iteration limiting metric. The method then out puts a result of the verification of the design.

In certain embodiments of the present invention, if the test coverage value is at least equal to a target value, and the method also includes back annotating the simulation results based on a test plan on which the simulation test cycle is derived.

In some embodiments of the present invention, the method will end the simulation test cycle if the test coverage value is at least at a target value.

In yet other embodiments of the present invention, the method will end the simulation test cycle if the test coverage value does not reach a target value after the simulation test cycle fails to satisfy the iteration limiting metric.

In more embodiments of the present invention, the iteration limiting metric is a target increase in test coverage for a current iteration of the simulation test cycle or a predetermined amount of iterations.

In some other embodiments of the present invention, at least one of the one or more simulation test cycle parameters is an input stimuli and the method includes applying a bias to one or more stimuli when repeating a simulation test cycle in a test iteration. Sometimes, the bias comprises a weight applied to at least one select variable or the bias comprises a change in range of values of at least one select variable.

In certain embodiments of the present invention, at least one of the one or more simulation test cycle parameters is a random number generator seed.

In more embodiment of the present invention, the method may include outputting additional information regarding the verification of the design, wherein the additional information is one or more of a fault of the design, a condition that ended the simulation test cycle, or achieved coverage value.

According to other embodiments of the present invention, a testbench is used for verification of a design of an integrated circuit. The testbench includes a storage device that stores information representative of the design, and a processor in communication with the storage device. The processor is configured to obtain simulation results from the iteration of the simulation test cycle, and calculate, during the simulation test cycle, a test coverage value associated with the simulation results of the iteration of the simulation test cycle. If the test coverage value is less than a target value, the processors determines if the simulation test cycle fails to satisfies an iteration limiting metric. If the simulation test cycle satisfies the iteration limiting metric, the processor dynamically adjust one or more simulation test cycle parameter during the simulation test cycle.

In some embodiment of the present invention, the processor ends the simulation if the test coverage value is at least at a target value. The processor may also end the simulation test cycle if the test coverage value does not reach a target value after the simulation test cycle fails to satisfy the iteration limiting metric.

In certain embodiments of the present invention, the iteration limiting metric is a target increase in test coverage for a current iteration of the simulation test cycle or a predetermined amount of iterations. The iteration limiting metric could also be a target increase in test coverage for a current iteration of the simulation test cycle or a predetermined amount of iterations in other embodiment of the present invention.

In yet more embodiments of the present invention, at least one of the one or more simulation test cycle parameters is an input stimuli and the processor may be configured to adjust the stimuli.

In some embodiment, the processor may apply a bias to the stimuli. The bias may comprises a weight applied to at least one select variable in certain embodiments and in other embodiments, the bias comprises a change in range of values of at least one select variable.

In certain embodiments of the present invention, at least one of the one or more simulation test cycle parameters used by the testbench is a random number generator seed.

In more embodiment of the present invention, the processor may be further configured to output additional information regarding the verification of the design, wherein the additional information is one or more of a fault of the design, a condition that ended the simulation test cycle, or achieved coverage value.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Figure 1:
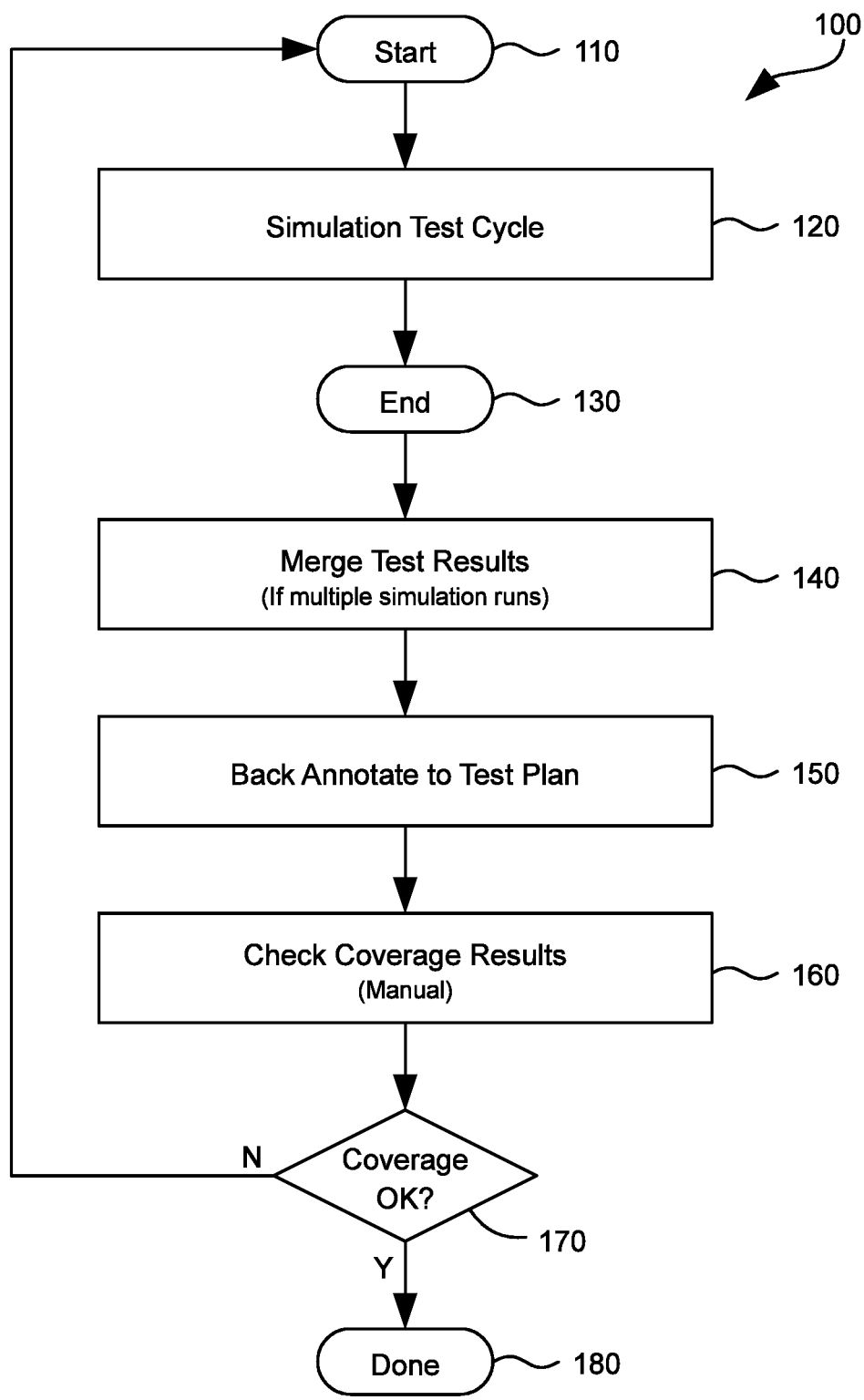
FIG. 1 shows a flow diagram of a method of running testbench simulations of a circuit design.

FIG. 1 is a flow chart of coverage testing of a device under test using conventional techniques 100.

The process starts at Step 110 with a simulation test cycle begins at Step 120. The simulation test cycle seeks to test how a design under test (not illustrated) reacts to certain stimuli. A skilled artisan would understand that the stimuli used for testing can vary based at least on the design under test. For example, one design under test may be a processor employing ARM architecture. Signals that could be sent along the microprocessor bus may act as the stimuli for a certain test of the design employing ARM architecture. A skilled artisan would also understand that stimuli, as well as the design under test, are not limited to any specific device or abstraction level. For example, the design under test could be an SSD controller that receives NVMe commands with different parameters as stimuli.

The test system, such as a standalone computer, dedicated test bench, or remote server will send the stimuli to the design under test, which could be a simulated device either local or remote. A skilled artisan would understand that while much of the discussion is with respect to virtual devices as the design under test, this invention can be employed in a number of other contexts, such as with physical devices being tested.

Even minor changes to a stimuli, such as a parameter in an NVMe command, may result in significant change in the expected behavior of the design under test. As a result, there can be hundreds, if not more, possible different combinations of stimuli to test against expected results.

In step 130, the process ends and results are catalogued. In some systems, this will take the form of database. For example, VCS® will use a xml database whereas other programs such as Xcelium® may use SQL based databases. A skilled artisan would understand that the database and/or output of the simulation test cycle could take many other forms, such as proprietary files specific to specific applications, without departing from the spirit of the invention.

There can be multiple simulation test cycles. For example, there can be multiple test cycles as part of the initial test design (e.g., running multiple tests with different RNG seeds at the beginning) or because the initial test did not pass the coverage check, which is discussed further herein. In cases of multiple simulation test cycles, at step 140, the test results are merged so that the coverage check can take into account all of the conducted tests not just the tests from one simulation test cycle. For example, if one simulation test cycle conducts tests 1, 3, and 5 of a five test set and a second separate simulation test cycle completes tests 4 and 5 from the same set, the merge results would show test 1, 3, 4, and 5 as completed from the set.

After the test results are merged (if needed), an engineer will begin to manually back annotate the results to the test plan in step 150. Back annotation can take many forms. For example, the results in the coverage database can be paired with entries in a spreadsheet, the test plan, to provide a mapping between the verification requirement and its specific coverage item. As part of this, the engineer will manually determine how particular coverage points faired during the test. For example, did a particular set of stimuli trigger a particular expected result, did a particular set of stimuli fail to trigger a particular result, or did a particular set of stimuli trigger an unexpected or not allowed result?

In step 160, there is a manual coverage check. Designers will confirm that all of the circumstances that they set out to test have been tested. Unfortunately, the traditional process only allows coverage to be checked after investing time into reviewing test results before it is known whether this effort is warranted. That is, the system will play no role or add any benefit to this portion of the process. Rather, manual review is conducted only after the test simulation has fully run and without any knowledge or indication whether the simulation test cycle merits manual review.

Generally, but not always, the desired coverage will be 100%. As a result, most results will not succeed using just one simulation test cycle. Even though it is likely that, in the traditional approach, achieving desired coverage will take multiple simulation test cycles this is only known for certain after manual review of each simulation test cycle in conjunction of manual review and merging of other simulation test cycles. This repetitive and time consuming manual process creates a series bottleneck in testing using traditional methods and systems. While a skilled artisan will understand that other coverage is acceptable due to system design, time constraints, quality of service parameters, customer requirements, and other details, it is assumed for the rest of the discussion that desired coverage is 100 percent.

Coverage can include, but is not limited to, specific reactions to input stimuli. For example, coverage could include transition from one state in a state machine to another or receiving expected output based on known input. However, a skilled artisan would understand that coverage is not limited to the foregoing examples. A skilled artisan would understand that coverage can vary based on system design and test parameters. For example, coverage could also include whether illegal state transition, transition that should not occur or transaction that occurred at the wrong time, are not inadvertently triggered.

Coverage need not be for the entire design under test. As a skilled artisan would understand more complex integrated circuits, multiple engineers can focus on testing different aspects of the design. As a result, a test coverage of some features might not be related to others and many might not be the total test coverage of the entire integrated circuit.

Although coverage can be tracked manually by tracking expected results on paper or electronically, coverage can also be coded into specific formats so that they can be loaded into testing tools. For example, coverage can be written in a specific format according to the System Verilog programming language. Regardless, coverage is generally designed by an engineer. However, a skilled artisan will understand that with the rise of artificial intelligence and machine learning, coverage does not have to always be written by a human.

Further, while the desired coverage value may vary based on test conditions and requirements, a skilled artisan would understand that different desired coverage values all face the same bottleneck that prevent any corrections to test until they have fully run, which may be time and energy consuming, and manually checked, which requires human review and analysis that may only show more simulation test cycles need to be run. Additionally, since the coverage check can only be done after manual review, which occurs after the completion of the simulation test cycle, no changes can be made during the simulation test to adjust the simulation test cycle. As a result, a simulation test cycle may run even if there is no chance, for example due to poorly designed stimuli, that the simulation test cycle will ever achieve the desired coverage value or achieve and improved coverage value over prior simulation test cycles. Thus, the traditional approach can result in a significant waste of time, energy, and resources both more machines and engineers.

At step 170, it is determined whether the coverage check was successful and whether the right percentage of tests have been conducted. If the coverage is sufficient, for example, 100%, then the testing process 100 ends at Step 180.

However, as described above, with the traditional approach, because the check is only conducted after the simulation test cycle has ended, there is no guarantee that the coverage check will be successful and the process will restart at Step 110 and attempt to achieve the desired coverage level by running another simulation test cycle. Unfortunately, this is not easy.

Should the coverage check find that only 90% coverage has been successfully tested, it is very hard to quickly and easily test the remaining ten percent. For example, the simulation test cycle could be run again using a different RNG seed. The different RNG seed should vary some of the stimuli generated. Additionally, in certain scenarios, such as whether the testing and coverage are written in the System Verilog language, it is also possible to limit the range of a stimuli, apply different weights to stimuli, or set the system to attempt to achieve a particular distribution of stimuli. A skilled artisan would understand the foregoing are only examples of parameters the can be changed for a test and that many other test parameters can be altered to affect the test. Further, a skilled artisan would understand that many different parameters can be alters as part of the innovative coverage test approach described in further detail below.

However, there is no guarantee that this will result in 100% coverage. Instead, and often likely, the subsequent run will also return less than 100% coverage. For example, 95% coverage. Yet, the test coverage between the two simulation test cycles may, and in fact likely do, have significant overlap such that even with multiple tests there is unlikely to be 100% coverage. This results in a potential for a significant time drain as coverage is checked manually over and over after each simulation test cycle until (hopefully) 100% coverage is achieved.

Figure 2:
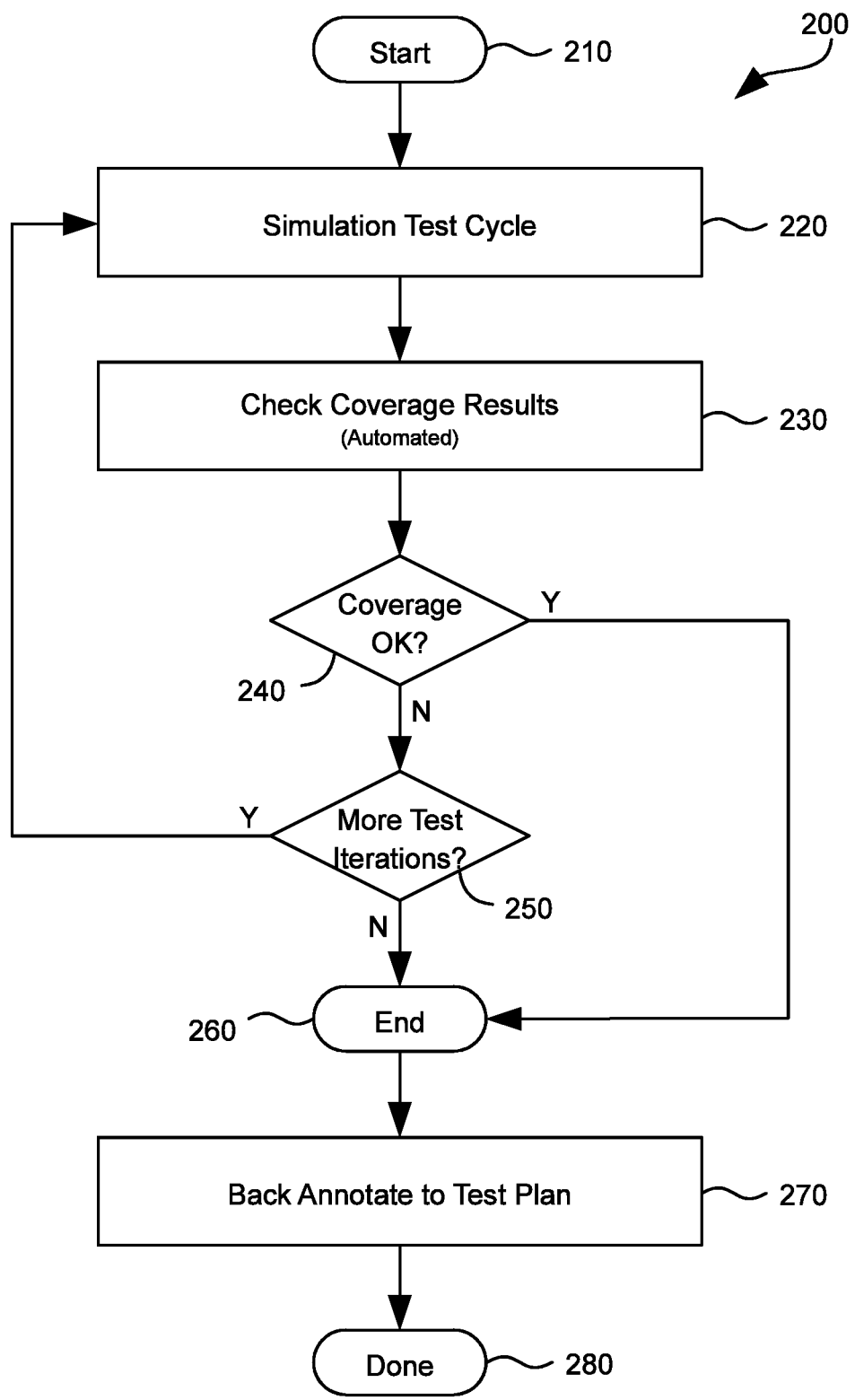
FIG. 2 shows a flow diagram of an optimized method of running testbench simulations of a circuit design, according to one or more embodiments of the present disclosure.

FIG. 2 illustrates a flow diagram for an improved coverage check according to certain embodiments of the present invention.

As with the traditional approach, the improved process 200 starts (step 210).

In Step 220, a simulation test cycle begins. However, unlike with the traditional approach, the simulation test cycle does not automatically end after tests are complete. Rather, as part of the new simulation test cycle, there is an automated check of coverage results in step 230.

Further, instead of relying on human engineers to check the results, determine the coverage, and determine if new tests are needed, the system will automatically determine the coverage percentage. Additionally, because the coverage check is automated and the system can determine whether it is worth for engineers to manually intercede and review the test results less engineering man-hours are require for testing. Moreover, the automated process will make it more seamless for different engineers to take over or alternate task such supervising the test.

If there is acceptable coverage (e.g., 100% coverage), then simulation test cycle will proceed to step 260 and end. The process of the automated coverage check is described in more detail below. However, if coverage results are unacceptable (e.g., below 100%), then the system will not end the simulation test cycle once results are acquired. Rather, the system will determine whether the simulation test cycle should run another round of tests and attempt to achieve the desired coverage level.

Infinite tests will not guarantee achieving 100 percent coverage. For example, the underlying test design could be faulty such that it is impossible to achieve 100 percent coverage. As a result, in certain embodiments, a metric, such as the number of iterations possible for a simulation test cycle, can be set and assigned to the simulation test cycle to prevent endless testing that is unlikely to achieve the desired coverage value. In such embodiments, at step 250, as part of the simulation test cycle, the system checks if the metric has been exceeded. For example, in certain embodiments it is determined whether the number of remaining iterations allocated to the simulation test cycle has been exceed or if there are still more allocate iterations left.

If there are, then the simulation test cycle will return to step 220 and the test cycle will begin again by varying test parameters. For example, the next test iteration may be run automatically with a different RNG seed. However, a skilled artisan would understand that a wide variety of test parameters can be alter as part of the automated process without departing from the spirit of the invention. For example, some stimuli ranges may be constrained or stimuli may be weight differently. In some embodiments, how the parameters are changed during the simulation test cycle can be hardcoded a priori to change in a specific order, based on which tests need to be covered. However, a skilled artisan would understand that this is not the only approach. Any number of other approaches to automatically vary the parameters during the simulation test cycle. For example, the system could include a decision tree to determine which parameters to change based on the known results and/or currently achieved test coverage. As another non-limiting example, artificial intelligence and machine learning can be employed to detect an impact of stimuli and vary the related parameters accordingly. This dynamic on file adjustment is not compatible with traditional testing approaches.

One particular advantage of the new approach is that engineers can determine ahead of time which specific stimuli have a large impact on which tests. That way if some test are being covered but others are not, the system can determine which stimuli are more closely associated with non-covered tests. Then these stimuli may be weight more heavily, or other stimuli weighted less, or certain stimuli ranges constraints in order to increase the chances that the next test iteration covers the non-covered test and increases the overall coverage value.

Further, by altering parameters dynamically during the test cycle, rather than after a test cycle has concluded not only automates the process, but significantly cuts down on the commitment required from engineers. The dynamic adjustment during the testing cycle will allow a single test to cover far more variables and increase the likelihood of success as compared with traditional test designs and adjustments thereof.

However, if the simulation test cycle has exceeded its allocated amount of test iterations, then the process proceeds to step 260 and ends, thereby allowing back annotation to the test plan in step 270.

In certain embodiments, step 260 may also include outputting overall test results. For example, in 260 the engineer may receive a message through any suitable medium, such as email, text, or as a message on the display of the system running the test. If the test was successful, the message will inform engineers of this. In some embodiments, this can include additional information alongside confirmation that the test was successful. For example, the method may output the ultimate coverage value, which would be useful where the target coverage value is less than 100 percent so that engineers may know if there test out performed target goals and by how much.

On the other hand, if the simulation test cycles fail to achieve the desired test coverage before ending the test (e.g., because the maximum number of iteration has been run or the coverage values were not changing over time) the engineers will receive a different message indicating the test was not successful. This message may also be accompanied by additional information. For example, the cause of the failure may be include, such as indicating the maximum number of permissible iterations has been reached. This additional information may be particularly helpful where multiple parameters can trigger an end of test event. Further, the additional information may provide further details such as the how much coverage was changing, what iteration had the most impact on coverage, or the status of the ultimate coverage achieved.

In the case certain embodiments, the additional information may include specific information regarding the design under test, such as a fault of the design under test. For example, the coverage of the test may be 100 percent, but the simulation test cycle may indicate that although a particular feature or stimuli was tested but the results show an unexpected or problematic behavior.

A skilled artisan would understand that the output can take many formats and that a wide variety of additional information, both that describe above and other information, may be presented in addition to either a success or failed test message. Further, a skilled artisan would understand that the additional information may be out put together with the success or failure message, can be part of the same message, or be completely separate without departing from the spirit of the invention.

While an iteration count is an example of a metric that can be used for the simulation test cycle, a skilled artisan would understand that it is not the only possible metric. For example, the metric could be the variance in test coverage such that if the system is not seeing significant changes, it will stop iterating test cycles.

Further, the metric does not have to be limited to a single factor. For example, both coverage value variance and amount of iterations could be used together or one could be used as a bias for the other. As another example, the metric could be a hybrid and take into account an expected decay rate for the remaining coverage per iteration to prevent iterating where results are not improving. For example, in a scenario where the metric has an iteration count of five and on the first test achieves an average test coverage across all the coverage points of 84 percent, the system will run another iteration of the simulation test cycle. Then, on the subsequent iteration, the system achieves an average coverage of 87 percent, but on the third iteration results in only 89 percent coverage, the system will determine the metric has not been satisfied. Even though the system had two more possible iterations to run before it hit the iteration limit, the system can determine that the tests are not following the expect decay rate and therefore the likelihood that additional iterations will achieve complete coverage are unlikely. The decay factor could be preset, determined by the system based on the current achieved coverage and the amount of remaining iterations, determined after the first iteration, or any number of other possible designs without departing from the spirit of the invention.

A skilled artisan would understand any number of metrics can be used in step 250 without departing for the spirit of the invention.

Although the above examples are shown with one coverage check per iteration after testing has been conducts, the invention is not so limited. For example, the coverage check may occur during the test or multiples during a single iteration of the simulation test cycle. Early checks can be particularly advantageous during long test iterations to determine whether it is worth continuing the current iteration or ceasing the iteration early because, for example, it becomes apparent that the current iteration will not expand the current coverage. As a result, it would be possible to save even more time and effort by not conducting test iterations that will not achieve the desired coverage or even improvement in coverage.

Regardless of whether adequate coverage is achieved or the test runs out iterations (or fails other metrics), the automated approaches according to the various embodiments of the present invention will significantly outperform traditional approaches. For example, automatic variation of test parameters and test reruns during a single simulation test cycle with a good test design will more quickly and efficiently achieved the desire coverage without the need for constant engineer analysis and supervision. This results in improved testbenches, and other testing systems, that are more efficient and capable of adjusting on-the-fly and without human intervention as part of the simulation test cycle rather than running a test simulation cycle and then awaiting manual analysis and input as to whether another simulation test cycle needs to be performed. As a result, a single iterative test simulation cycle can replace multiple simulation test cycles and dynamically adjust testing parameters, such as stimuli biases (e.g., weights, ranges, RNG seeds, etc.) to increase the likelihood of achieving complete coverage and doing so in a short period of time.

Even if the underlying test is flawed, the metrics in place to prevent an endless simulation test cycle will quickly and efficiently identify flawed tests by alerting engineers to the fact that the current test will not achieve coverage in a reasonable time. The test could also be ended as soon as such a flaw is detected. This improves testbenches, and other testing systems, by allowing the systems to themselves determine when a simulation test cycle need not run to completion. As a result, the systems will be more energy efficient as intensive workloads associated with testing will only occur when they are beneficial.

There is a variety of additional reasons that the new approach is more efficient and a few examples are throughout this application. A skilled artisan would understand that these are not the only advantages.

For example, unlike the traditional approach where databases or manual annotations containing results for multiple simulation test cycles have to be merged before any analysis takes place, the automated approach has no such constraint. Rather, in certain embodiments of the invention, a single database or other storage location collects data from each iteration until either the desired coverage is achieved or the simulation test cycle exceeds its iteration limit or fails another metric designed to prevent endless or overly long simulation test cycles. Thus, not only is the traditional bottleneck eliminated but other improvements are possible.

Another example of a benefit of the new approach is also captured in step 270. Unlike in the traditional approach, the engineer will only undertake the back annotation process if they know the test has achieved the desired coverage. Since back annotation is no longer a precursor to coverage checks, even if back annotation remains a manually process or involves direct engineer supervision, additional time, effort and resources are only devoted to this process when it is known that the investment will pay off. This allows engineer to leverage the tools, such as testbench, in a more efficient manner.

As a non-limiting examples, the above methods can be implemented in prebuilt commercial tools such as VCS Simulator or Cadence. However, a skilled artisan will understand that the methodology discussed herein is tool independent and can be applied in a variety of tools and contexts without departing from the spirit of the inventions. There is little to no consequence from multiple checks because the automated coverage checks can be carried out quickly and without interfering with the test, for example, by sending a single predetermined command or a short sequence of commands to the tool.

Figure 3:
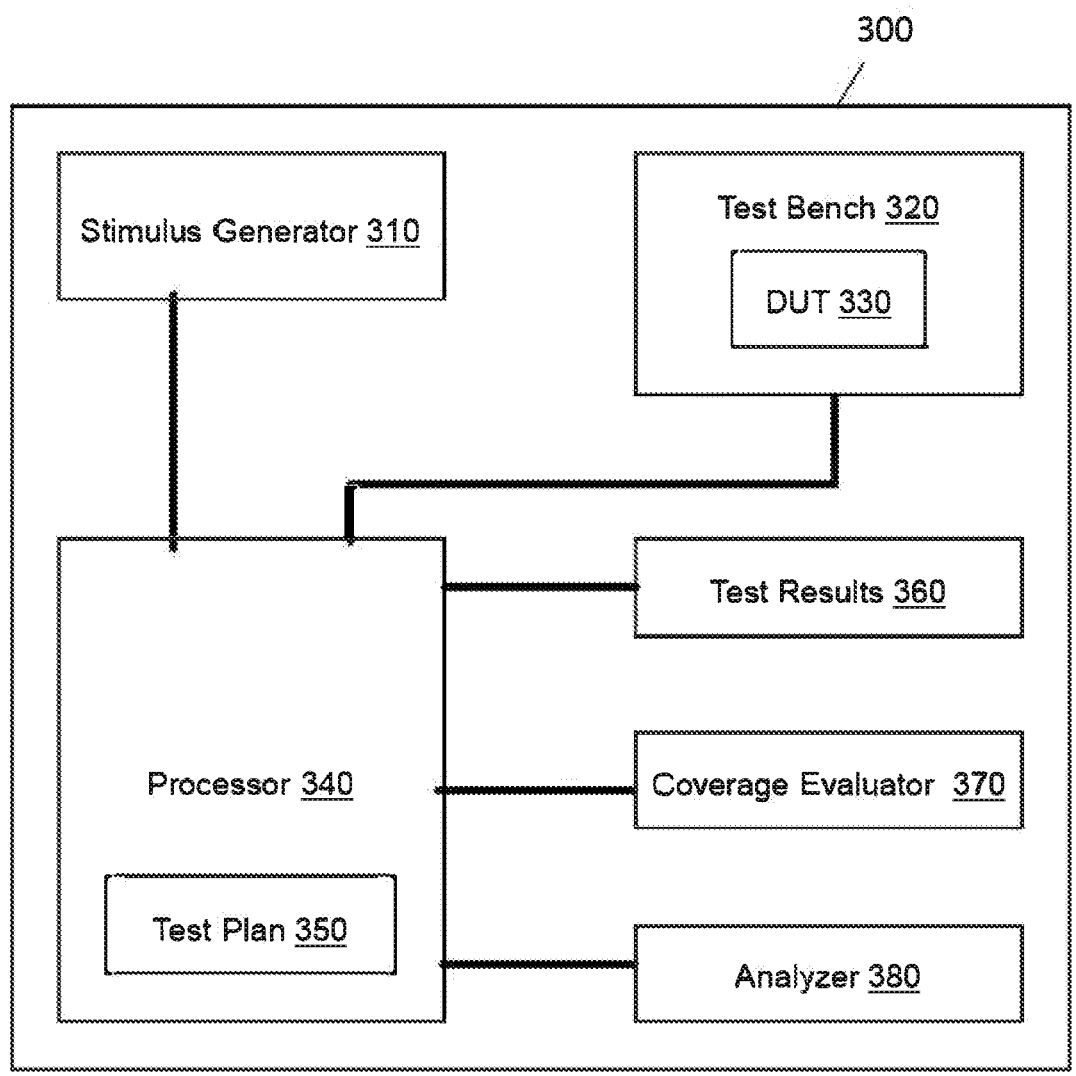
FIG. 3 shows a system for implementing one or more of the embodiments of the present disclosure.

FIG. 3 illustrates a system 300 that can be used to implement certain embodiments of the present invention.

System 300 includes a stimulus generator 310. Stimulus generator 310 generates the various stimuli that are used during the testing process. Testbench 320 feeds the stimuli generated by stimuli generator 310 to a virtual representation of the design under test 330.

The design under test 330, along with other components described herein, can be store with the system on an internal, or external, storage device (not illustrated), such as an SSD, HDD or other suitable form of non-volatile memory. A skilled artisan would understand that storage within system 300 does not have to be limited to a single storage device nor is the storage device limited to an SSD.

Stimulus generator 310 and test bench 320 may be run and/or controller by processor 340. However, a skilled artisan would understand that this need not be the case and that many alternatives exist without departing from the spirit of the invention. For example, system 300 may operate in a distributed fashion with various components being located on different computers or servers. Testbench 320 and/or the storage devices are in communication with the processor.

This could be a local hardwire, but is not limited to such a connection. Rather, a skilled artisan would understand that any number of communication lines could exist. For example, the communication may occur over an intranet, internet, or other network.

Processor 340, which may be a Central Processing Unit (CPU) or other processor, handles test plan 350 and can implement one or more embodiments of the present invention. Processor 340 executes the test plan and begins the first test simulation cycle. During the cycle, test results are output to test results 360, which are stored on system 300. Test results 360 can take a number of forms. For example, the test result could be output to a text document or a structure database. However, a skilled artisan will understand that there are a wide variety of suitable techniques to store and maintain test results 360 without departing from the spirit of the invention.

As the test simulation cycle is run, during or after the completion of an iteration, coverage collector 370 will update the coverage value achieved by the iteration (or series of iterations). In one example, coverage collector 370 will include a coverage object that will collect coverage results from one or more coverage points. Coverage points may include a number or targets that need to be tested. For example, a coverage point may seek to test for possibilities for a variable that ranges from 0-225: a) the variable with a value of 0 was tested; b) the variable with a value off 255 was tested; c) the variable with a value of 0-127 was tested; and d) the variable with a value of 128-255 was tested. The goal is to test the design with the target variable taking on different values to observe how the device functions in response. If during an simulation test cycle, the variable was tested with a value of 0, 85, and 255 then only target a), b), and d), but c) were tested and the coverage result for this specific coverage point would be 75%. However, a skilled artisan will realize that the forgoing is only an example and that a coverage point may have nay number of tests without departing from the spirit of the invention. In some embodiments, a coverage object may collect coverage results from more than one coverage point. In certain embodiments, there can be more than one coverage object and the coverage objects will be used to collect coverage results from specific coverage points. Multiple coverage objects will allow individual coverage objects to be designed for more specific uses in cases where a generic coverage object might not be sufficient. In certain embodiments where there are multiple coverage objects, there may be a coverage wrapper that collates the coverage result for the various coverage objects and provide an average coverage value that represents the coverage value of the iteration and/or simulation test cycle. In some embodiments, the average may be a generic means of the coverage results collected and reported by each coverage object. In other embodiments, the average coverage may be a weight value where results from certain coverage objects are weight more heavily. For example, coverage objects that check more coverage points may be weighted more than other coverage object. As another example, some coverage objects may be weighted more heavily because the engineers determine that those coverage points are more important. A skilled artisan would understand that there are many approaches for how a coverage value may be calculated without departing from the spirit of the invention.

In order to help facilitate effective coverage result collection, in certain embodiments, each coverage point is associated with a unique value, name, or other unique identifier so the coverage objects, and other parts of system 300, can keep track of the coverage points and provide unique updates. Unique identification can help identify why a test failed, but more importantly, allows real time gathering and updating of coverage result that is impossible with the traditional approach that relies on manual after the fact coverage checks.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A method of verifying a design of an integrated circuit, comprising:
    executing an iteration of simulation test cycle using a digital representation of the design;
    obtaining simulation results from the iteration of the simulation test cycle;
    calculating, during the simulation test cycle, a test coverage value associated with the simulation results of the iteration of the simulation test cycle;
    if the test coverage value is less than a target value, determining if the simulation test cycle fails to satisfies an iteration limiting metric; and
    if the simulation test cycle satisfies the iteration limiting metric,
        dynamically adjusting one or more simulation test cycle parameter during the simulation test cycle;
        iterating the simulation test cycle and recalculating the test coverage value until the test coverage value is at least the target value or the simulation test cycle fails to satisfy the iteration limiting metric; and
        outputting a result of the verification of the design.

2. The method of claim 1, further comprising:
    if the test coverage value is at least equal to a target value, back annotating the simulation results based on a test plan on which the simulation test cycle is derived.

3. The method of claim 1, further comprising:
    ending the simulation test cycle if the test coverage value is at least at a target value.

4. The method of claim 1, further comprising:
    ending the simulation test cycle if the test coverage value does not reach a target value after the simulation test cycle fails to satisfy the iteration limiting metric.

5. The method of claim 1, wherein the iteration limiting metric is a target increase in test coverage for a current iteration of the simulation test cycle or a predetermined amount of iterations.

6. The method of claim 1, wherein at least one of the one or more simulation test cycle parameters is an input stimuli, the method further comprising:
    applying a bias to one or more stimuli when repeating a simulation test cycle in a test iteration.

7. The method of claim 6, wherein the bias comprises a weight applied to at least one select variable.

8. The method of claim 6, wherein the bias comprises a change in range of values of at least one select variable.

9. The method of claim 1, wherein at least one of the one or more simulation test cycle parameters is a random number generator seed.

10. The method of claim 1, wherein the method further comprises:

outputting additional information regarding the verification of the design, wherein the additional information is one or more of a fault of the design, a condition that ended the simulation test cycle, or achieved coverage value.

11. A testbench for verification of a design of an integrated circuit comprising:

a storage device that stores information representative of the design; and a processor in communication with the storage device, the processor configured to:

execute an iteration of a simulation test cycle using a digital representation of the design;

obtain simulation results from the iteration of the simulation test cycle;

calculate, during the simulation test cycle, a test coverage value associated with the simulation results of the iteration of the simulation test cycle;

if the test coverage value is less than a target value, determine if the simulation test cycle fails to satisfies an iteration limiting metric; and if the simulation test cycle satisfies the iteration limiting metric, dynamically adjust one or more simulation test cycle parameter during the simulation test cycle;

iterate the simulation test cycle and recalculating the test coverage value until the test coverage value is at least the target value or the simulation test cycle fails to satisfy the iteration limiting metric; and output a result of the verification of the design.

12. The testbench of claim 11, wherein the processor is further configured to:

end the simulation if the test coverage value is at least at a target value.

13. The testbench of claim 11, wherein the processor is further configured to:

end the simulation test cycle if the test coverage value does not reach a target value after the simulation test cycle fails to satisfy the iteration limiting metric.

14. The testbench of claim 11, wherein the iteration limiting metric is a target increase in test coverage for a current iteration of the simulation test cycle or a predetermined amount of iterations.

15. The testbench of claim 11, wherein at least one of the one or more simulation test cycle parameters is an input stimuli, and the processor is further configured to:

apply a bias to one or more stimuli when repeating a simulation test cycle in a test iteration.

16. The testbench of claim 15, wherein the bias comprises a weight applied to at least one select variable.

17. The testbench of claim 15, wherein the bias comprises a change in range of values of at least one select variable.

18. The testbench of claim 11, wherein at least one of the one or more simulation test cycle parameters is a random number generator seed.

19. The testbench of claim 11, wherein the processor is further configured to:

output additional information regarding the verification of the design, wherein the additional information is one or more of a fault of the design, a condition that ended the simulation test cycle, or achieved coverage value.

* * * * *